（12）United States Patent
Yamada

(10) Patent No.: US 12,413,042 B2
(45) Date of Patent: Sep. 9, 2025

(54) SEMICONDUCTOR LASER ELEMENT, LIGHT EMITTING DEVICE, AND METHOD FOR MANUFACTURING THESE

(71) Applicant: NICHIA CORPORATION, Anan (JP)

(72) Inventor: Kohei Yamada, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 673 days.

(21) Appl. No.: 17/699,068

(22) Filed: Mar. 18, 2022

(65) Prior Publication Data
US 2022/0302670 A1    Sep. 22, 2022

(30) Foreign Application Priority Data
Mar. 19, 2021    (JP) .................................. 2021-045643

(51) Int. Cl.
H01S 5/0238    (2021.01)
H01S 5/02    (2006.01)
H01S 5/026    (2006.01)
H01S 5/028    (2006.01)
H01S 5/042    (2006.01)

(52) U.S. Cl.
CPC ............ H01S 5/026 (2013.01); H01S 5/0202 (2013.01); H01S 5/028 (2013.01); H01S 5/04256 (2019.08)

(58) Field of Classification Search
CPC ........ H01S 5/026; H01S 5/0202; H01S 5/028; H01S 5/04256; H01S 5/0014; H01S 5/0234; H01S 5/0282; H01S 5/32341; H01S 5/0238; H01S 5/02255; H01S 5/22; H01S 2301/176
See application file for complete search history.

(56) References Cited

U.S. PATENT DOCUMENTS

2003/0048818 A1*  3/2003  Takeuchi ............ H01S 5/04252
                                                                    372/36
2003/0165169 A1*  9/2003  Nomoto .............. H01S 5/04254
                                                                    372/46.01
2004/0071176 A1   4/2004  Ohta et al.
(Continued)

FOREIGN PATENT DOCUMENTS

JP    2004-095859 A    3/2004
JP    2005-101044 A    4/2005
(Continued)

Primary Examiner — Xinning (Tom) Niu
(74) Attorney, Agent, or Firm — Global IP Counselors, LLP

(57) ABSTRACT

A semiconductor laser element includes a semiconductor-containing part, an electrode and at least one metal film. The semiconductor-containing part has first and second main surfaces, a light emitting end surface, a light reflecting end surface, and an optical waveguide. A distance between the first main surface and the optical waveguide is greater than a distance between the second main surface and the optical waveguide. The electrode is provided on the first main surface. The metal film is provided on the first main surface at a position spaced apart from the electrode. The metal film is in contact with a first side of an outer edge of the first main surface on a side of the light emitting end surface. The metal film is arranged at a position that does not overlap the optical waveguide in a plan view seen along a normal direction of the first main surface.

16 Claims, 12 Drawing Sheets

(56) References Cited

U.S. PATENT DOCUMENTS

| | | | | |
|---|---|---|---|---|
| 2004/0087113 | A1* | 5/2004 | Muraishi | H01S 5/0238 |
| | | | | 438/460 |
| 2009/0116528 | A1* | 5/2009 | Kawaguchi | H01S 5/32341 |
| | | | | 372/50.1 |
| 2011/0079809 | A1 | 4/2011 | Nomaguchi | |
| 2011/0142089 | A1* | 6/2011 | Kudo | H01S 5/22 |
| | | | | 372/46.012 |
| 2018/0366912 | A1* | 12/2018 | Hashimoto | H01S 5/22 |

FOREIGN PATENT DOCUMENTS

| | | |
|---|---|---|
| JP | 2011-035315 A | 2/2011 |
| JP | 2011-077456 A | 4/2011 |
| JP | 2011-242602 A | 12/2011 |
| JP | 2015-130409 A | 7/2015 |
| JP | 2015-231038 A | 12/2015 |

* cited by examiner

SEMICONDUCTOR LASER ELEMENT, LIGHT EMITTING DEVICE, AND METHOD FOR MANUFACTURING THESE

CROSS-REFERENCE TO RELATED APPLICATION

The present application claims priority to Japanese Patent Application No. 2021-045643, filed on Mar. 19, 2021, the disclosure of which is hereby incorporated by reference in its entirety.

BACKGROUND

The present disclosure relates to a semiconductor laser element, a light emitting device, and a method for manufacturing these.

In Japanese Laid-Open Patent Application Publication No. 2004-095859, noted is a method for manufacturing a semiconductor laser that obtains individual semiconductor lasers by forming a plurality of electrode patterns that are smaller than the chip size that fits within the chip size of a resonator length, and dividing between the electrode patterns. In Japanese Laid-Open Patent Application Publication No. 2004-095859, with this method, since it is difficult to produce a laser chip of different resonator lengths from the same semiconductor wafer, as a solution, noted is a method for manufacturing a semiconductor laser that forms the electrode patterns continuously in the resonator length direction. With this method, individual semiconductor lasers are obtained by cleaving at a position that crosses the electrode patterns.

SUMMARY

With the laser elements obtained by dividing between electrode patterns, since there is no electrode pattern on the end surface of the laser elements, there are cases when it is not possible to determine the position of the end surface of the laser element using an image recognition device, etc. In this case, for example, the electrode pattern is recognized using an image recognition device, etc., and the end surface is estimated to be at a position at a prescribed distance from that electrode pattern. It is possible to perform various types of pass/fail determination of the position at which the laser element is mounted based on such an estimate, for example, but since the actual position of the end surface does not necessarily match the estimated position, there is a possibility that an item that is originally a good item will be erroneously determined as a defective item.

Also, when cleaving is performed at a position that crosses the electrode patterns as with the manufacturing method noted in Japanese Laid-Open Patent Application Publication No. 2004-095859, the electrode pattern is formed up to the end part obtained by cleaving, but on the other hand, there is a risk of causing a short circuit, etc., due to the electrode pattern stretching due to cleaving.

The present disclosure includes the following embodiments according to one aspect of the present invention.

A semiconductor laser element according to one aspect of the present invention includes a semiconductor-containing part, an electrode and at least one metal film. The semiconductor-containing part has a first main surface, a second main surface, a light emitting end surface, a light reflecting end surface, and an optical waveguide. A distance between the first main surface and the optical waveguide is greater than a distance between the second main surface and the optical waveguide. The electrode is provided on the first main surface. The at least one metal film is provided on the first main surface at a position spaced apart from the electrode. An outer edge of the first main surface has a first side on a side of the light emitting end surface. The at least one metal film is in contact with the first side of the outer edge of the first main surface. The at least one metal film is arranged at a position that does not overlap the optical waveguide in a plan view seen along a normal direction of the first main surface.

A light emitting device according to one aspect of the present invention includes the semiconductor laser element described above, and a base on which the semiconductor laser element is fixed. The semiconductor laser element is fixed to the base in an arrangement in which the second main surface of the semiconductor-containing part faces the base.

A method for manufacturing a semiconductor laser element according to one aspect of the present invention includes: preparing a semiconductor-containing part having a first main surface, a second main surface, and an optical waveguide, a distance between the first main surface and the optical waveguide being greater than a distance between the second main surface and the optical waveguide; forming a plurality of electrodes and at least one metal film on the first main surface of the semiconductor-containing part so that the electrodes are aligned in a first direction, and the at least one metal film is arranged at a position that is between the electrodes and spaced apart from the electrodes, and at a position that does not overlap with the optical waveguide in a plan view when seen along a normal direction of the first main surface; and cleaving the semiconductor-containing part at a position between the electrodes along a second direction intersecting the first direction thereby dividing the at least one metal film.

A method for manufacturing a light emitting device according to one aspect of the present invention includes preparing a semiconductor laser element using the method described above, and fixing the semiconductor laser element to a base in an arrangement in which the second main surface of the semiconductor-containing part faces the base.

With the semiconductor laser element, the light emitting device, and the method for manufacturing these described above, it is possible to improve the pass/fail determination precision.

DETAILED DESCRIPTION

Figure 1:
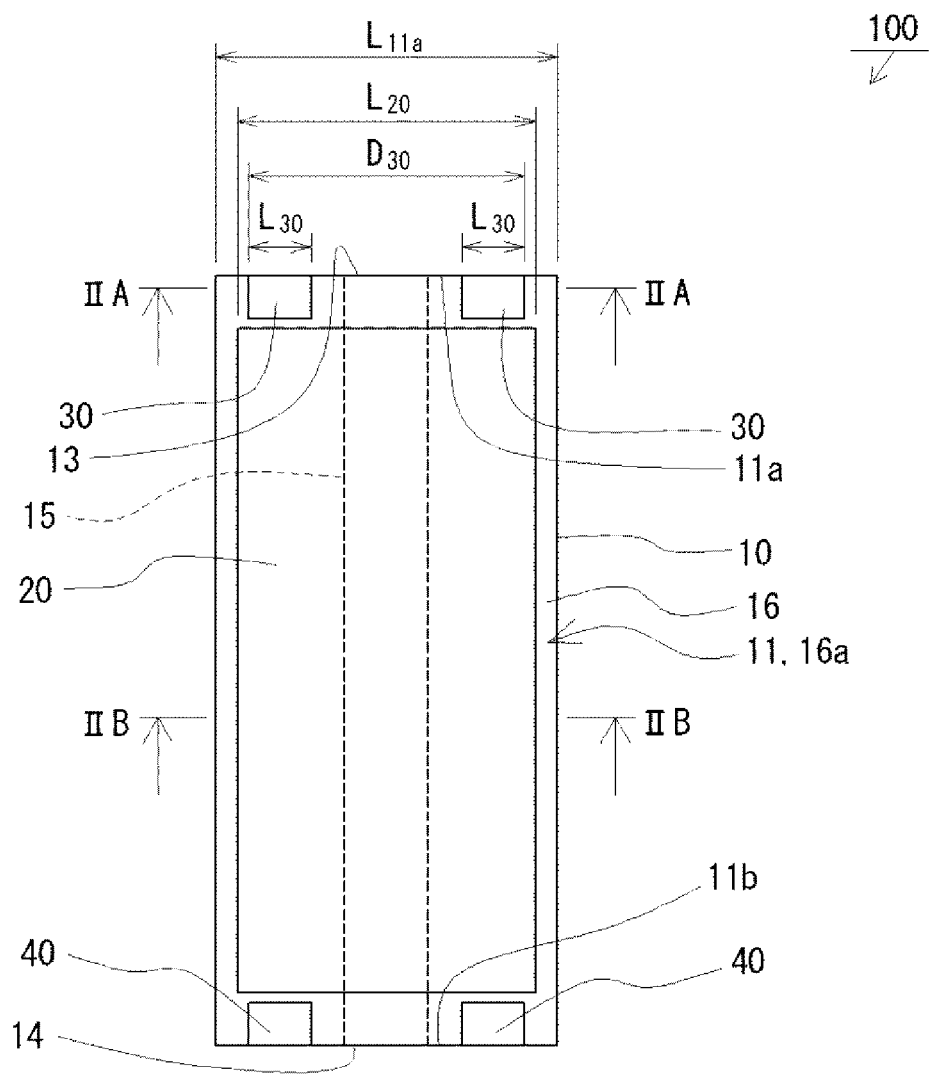
FIG. 1 is a schematic plan view showing a semiconductor laser element of an embodiment according to the present invention.

Hereafter, embodiments of the present invention are explained while referring to the drawings. In each drawing, the same code number is given to the same element. Also, in each cross section view, only the state of the cross section surface is shown, and illustrations of members that do not exist in that cross section surface are omitted.

Figure 2A:
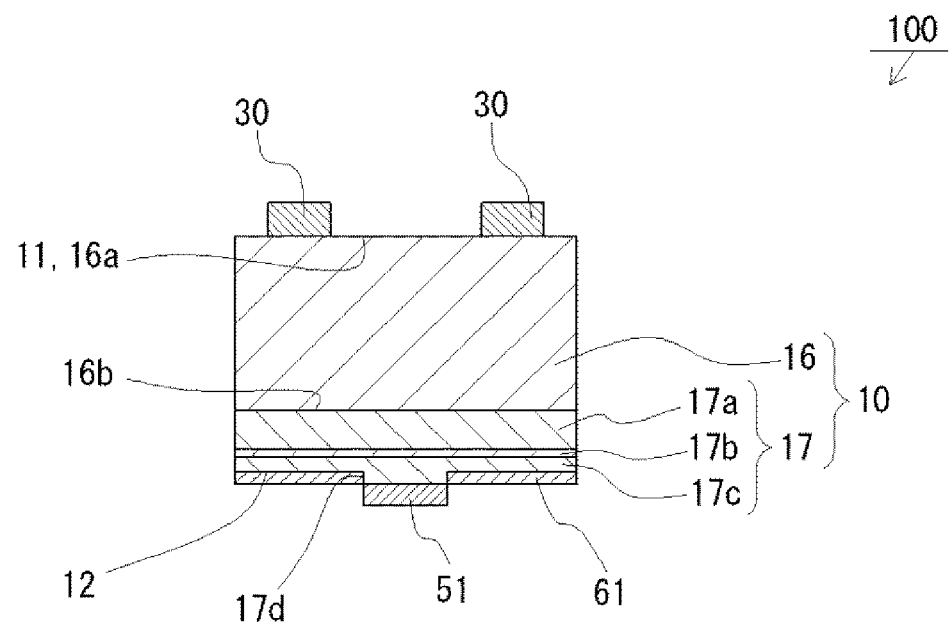
FIG. 2A is a cross section view of line IIA-IIA of FIG. 1.
Figure 2B:
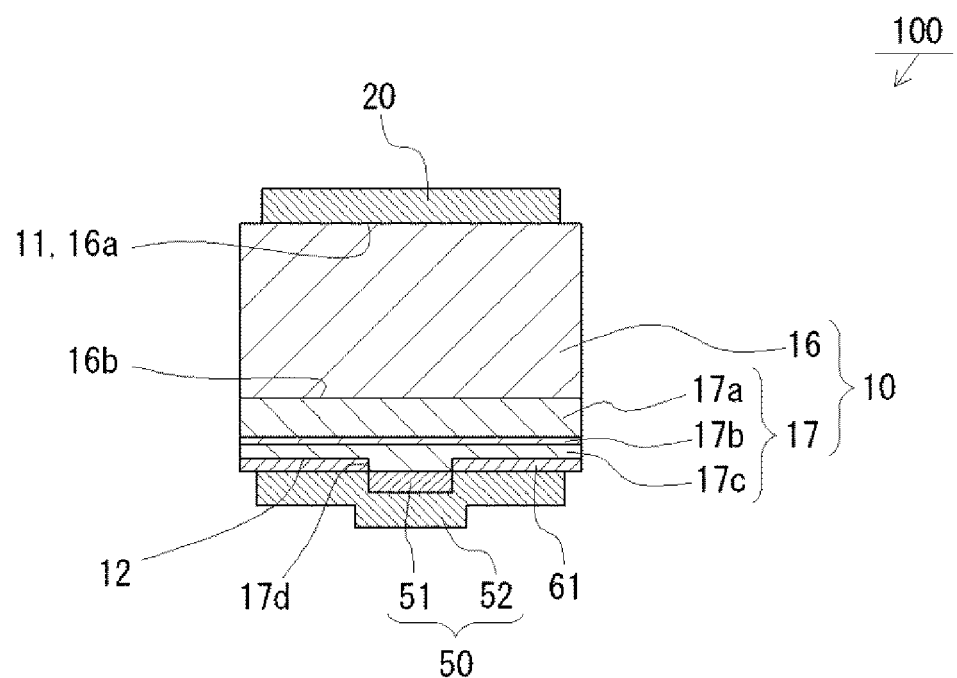
FIG. 2B is a cross section view of line IIB-IIB of FIG. 1.

FIG. 1 is a schematic plan view showing a semiconductor laser element of an embodiment. FIG. 2A is a cross section view of line IIA-IIA of FIG. 1. FIG. 2B is a cross section view of line IIB-IIB of FIG. 1. As shown in FIG. 1 to FIG. 2B, the semiconductor laser element 100 has a semiconductor-containing part 10, an electrode 20, and one or more metal films 30.

(Semiconductor-Containing Part 10)

The semiconductor-containing part 10 has a first main surface 11, a second main surface 12, a light emitting end surface 13, a light reflecting end surface 14, and an optical waveguide 15. The outer edge of the first main surface 11 has a first side 11a on the side of the light emitting end surface 13. The outer edge of the first main surface 11 has a second side 11b on the side of the light reflecting end surface 14. The outer edge of the first main surface 11 is a quadrangle, for example, in the plan view seen along the normal direction of the first main surface 11. The outer edge of the second main surface 12 is a quadrangle, for example, in the plan view seen along the normal direction of the second main surface 12. For example, the first main surface 11 is a flat plane, and a ridge 17d is provided on the second main surface 12. If a metal film 30 is provided on a part with a level difference, contrast occurs due to the level difference, so there is a possibility that the level difference will be erroneously detected as the outer shape of the metal film 30 by an image recognition device, etc. For this reason, it is preferable that the metal film 30 be provided on a flat part. If the first main surface 11 is a flat plane, there is no level difference regardless of where the metal film 30 is formed, so it is possible to improve the degree of freedom for the formation position of the metal film 30.

The distance between the first main surface 11 and the optical waveguide 15 is greater than the distance between the second main surface 12 and the optical waveguide 15. As a result, when the semiconductor laser element 100 is fixed to a base in an arrangement in which the second main surface 12 of the semiconductor laser element 100 faces the base as described later, it is possible to detect the positional relationship of the light emitting end surface 13 and the base using the metal film 30. Therefore, it is possible to improve the precision of the pass/fail determination of their positional relationship. The size relationship between the distance from the first main surface 11 to the optical waveguide 15 and the distance from the second main surface 12 to the optical waveguide 15 may be determined based on the size relationship between the distance from the first main surface 11 to an active layer 17b and the distance from the second main surface 12 to the active layer 17b. Specifically, if the distance between the first main surface 11 and the active layer 17b is greater than the distance between the second main surface 12 and the active layer 17b, it can be said that the distance between the first main surface 11 and the optical waveguide 15 is greater than the distance between the second surface 12 and the optical waveguide 15.

The optical waveguide 15 is arranged at a position connecting the light emitting end surface 13 and the light reflecting end surface 14. The optical waveguide 15 is a shape that is long in one direction, for example. The optical waveguide 15 is a shape that is long in the direction in which the light emitting end surface 13 and the light reflecting end surface 14 intersect, for example. The long direction of the optical waveguide 15 can intersect the light emitting end surface 13 and the light reflecting end surface 14 at an angle of 80 to 100°. The short direction of the optical waveguide 15 is the direction that intersects perpendicular to the long direction in the plan view.

The semiconductor-containing part 10 can have a substrate 16 and a semiconductor layer 17. The substrate 16 has a first substrate main surface 16a and a second substrate main surface 16b on the side opposite to the first substrate main surface 16a. The semiconductor layer 17 is provided on the second substrate main surface 16b of the substrate 16.

The substrate 16 is a semiconductor substrate, for example. A nitride semiconductor substrate such as a GaN substrate can be used as the substrate 16. The easy cleaving surface of a nitride semiconductor having a wurtzite structure of GaN, etc., is the m surface (specifically, {10-10} surface). For example, it is possible to form the semiconductor layer 17 on +c surface (specifically, the (0001) surface) of the substrate 16, and to use m surfaces of the substrate 16 and the semiconductor layer 17 as the light emitting end surface 13 and the light reflecting end surface 14. The +c surface is not limited to being a surface that strictly matches the (0001) surface, and also includes surfaces having an off angle within a range of ±1 degree. The m surface is not limited to being a surface that strictly matches the {10-10} surface, and also includes surfaces for which the skew from the {10-10} surface is less than 1 degree. It is also possible to not provide the substrate 16, and to have the semiconductor-containing part 10 consist only of the semiconductor layer 17.

The semiconductor layer 17 has a first electrically conductive semiconductor layer 17a, an active layer 17b, and a second electrically conductive semiconductor layer 17c. The semiconductor constituting these can be a nitride semiconductor, and can be a group 111 nitride semiconductor, for example. Examples of a group III nitride semiconductor include GaN, InGaN, and AlGaN.

The first electrically conductive semiconductor layer 17a is an n-type semiconductor layer, for example. The second electrically conductive semiconductor layer 17c is a p-type semiconductor layer, for example. The substrate 16, the first electrically conductive semiconductor layer 17a, the active layer 17b, and the second electrically conductive semiconductor layer 17c may each be in direct contact, or may have a separate semiconductor layer arranged therebetween. For example, it is possible to have an undoped layer arranged between the second electrically conductive semiconductor layer 17c and the active layer 17b. The active layer 17b can have a multiple quantum well structure or a single quantum well structure. As the plurality of layers formed on the substrate 16, examples include in order from the substrate 16 side an n-side clad layer, an n-side light guide layer, the active layer 17b, a p-side electron confinement layer, a p-side light guide layer, a p-side clad layer, and a p-side contact layer. For example, the n-side clad layer is the first electrically conductive semiconductor layer 17a, and the p-side contact layer is the second electrically conductive semiconductor layer 17c.

The semiconductor layer 17 has the ridge 17d provided on the surface of the side opposite to the substrate 16. In the plan view, the ridge 17d is arranged at a position that connects the light emitting end surface 13 and the light reflecting end surface 14. The ridge 17d has a long shape in one direction, for example. The ridge 17d has a long shape in the direction intersecting the light emitting end surface 13 and the light reflecting end surface 14, for example. The long direction of the ridge 17d can intersect the light emitting end surface 13 and the light reflecting end surface 14 at an angle of 80 to 100°. The ridge 17d can be a stripe shape, for example. The optical waveguide can be constituted by the ridge 17d. For example, in the plan view seen along the normal direction of the first main surface 11, the part that matches the ridge 17d can be regarded as the optical waveguide 15. The ridge 17d is formed on a portion of the top surface of the second electrically conductive semiconductor layer 17c, for example.

(Electrode 20)

The electrode 20 is provided on the first main surface 11. In FIG. 1 to FIG. 2B, the first main surface 11 is configured by the first substrate main surface 16a of the substrate 16. Specifically, the electrode 20 is provided on the first substrate main surface 16a. The electrode 20 is an n electrode, for example. The electrode 20 has one or more layers of a layer of one or more metals including Ni, Rh, Cr, Au, W, Pt, Ti, Al or an alloy, for example. The electrode 20 has an Au layer as the outermost layer, for example. The electrode 20 is not in contact with the first side 11a of the first main surface 11. In the plan view, the distance between the electrode 20 and the first side 11a can be 15 µm or greater, or can be 45 µm or less. The electrode 20 is not in contact with the second side 11b of the first main surface 11. In the plan view, the distance between the electrode 20 and the second side 11b may also be 15 µm or greater. The distance between the electrode 20 and the second side 11b can be 45 µm or less. The electrode 20 and the second side 11b may also be in contact. In FIG. 1, the electrode 20 is not arranged between the plurality of metal films 30, but it is also possible to arrange a portion of the electrode between the plurality of metal films 30. At least a portion of the electrode 20 can be arranged at a position that overlaps the optical waveguide 15 in the plan view seen along the normal direction of the first main surface 11.

(Metal Film 30)

The metal film 30 is provided on the first main surface 11. The metal film 30 is provided at a position spaced apart from the electrode 20. The metal film 30 is in contact with the first side 11a of the first main surface 11. The metal film 30 fulfills at least one of (a) and (b) below. It may also satisfy both. (a) A length $L_{30}$ along the first side 11a of the metal film 30 is smaller than a length $L_{20}$ in the direction parallel to the first side 11a of the electrode 20. (b) The metal film 30 is arranged at a position that does not overlap with the optical waveguide 15 in the plan view when seen along the normal direction of the first main surface 11.

By providing the metal film 30, it is possible to improve the pass/fail determination precision. Specifically, because the metal film 30 is in contact with the first side 11a of the first main surface 11, it is possible to determine the position of the light emitting end surface 13 using the metal film 30. This makes it possible to do pass/fail determination based on the actual position of the light emitting end surface 13, so it is possible to improve the pass/fail determination precision. Also, after fixing the semiconductor laser element 100 to the base described later, the position of the light emitting end surface 13 is specified by detecting the outline of the metal film 30 using an image recognition device, etc., and it is possible to perform pass/fail determination of the fixing position of the semiconductor laser element 100 from the positional relationship of the end part of the base and the light emitting end surface 13.

Figure 3:
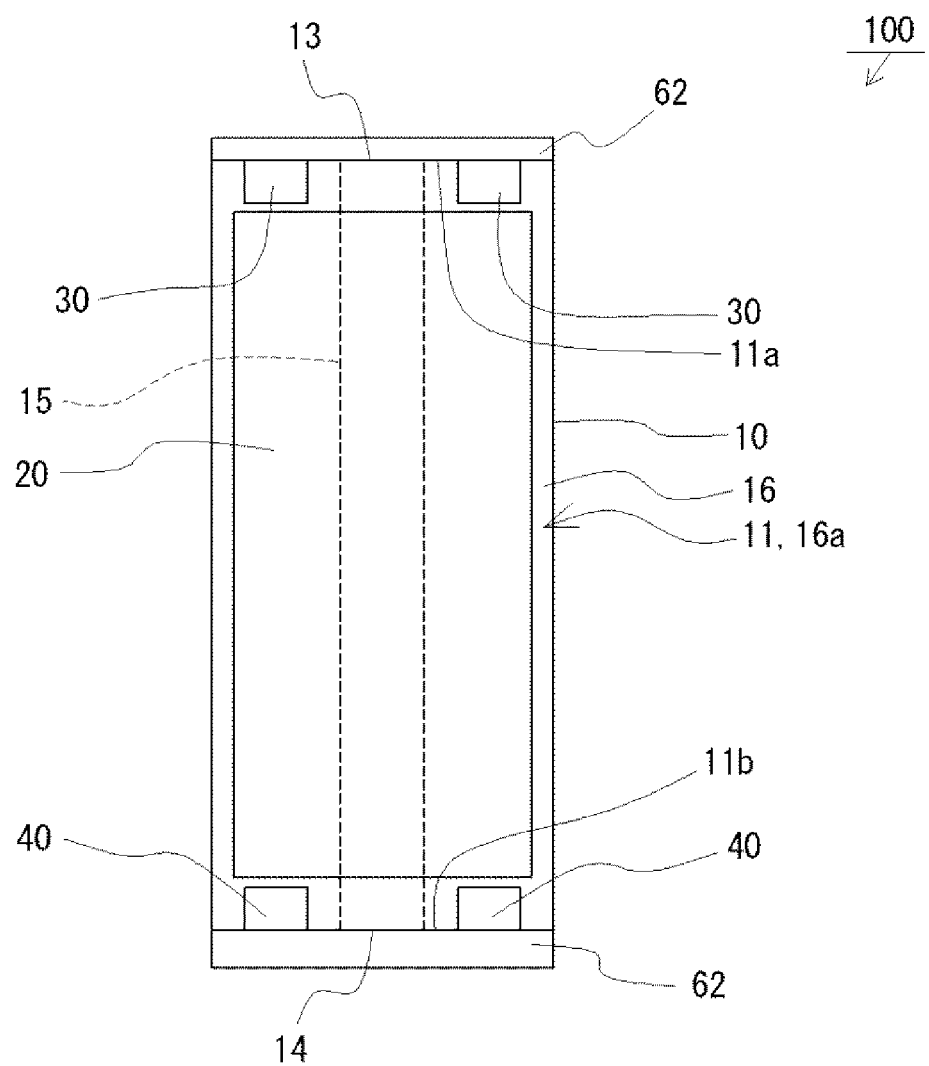
FIG. 3 is a schematic plan view showing another example of a semiconductor laser element of an embodiment according to the present invention.

Also, by providing the metal film 30, it is possible to reduce the probability that the end surface protective film 62 shown in FIG. 3 described later will reach the electrode 20. This is because there is the metal film 30 between from the light emitting end surface 13 to the electrode 20, and using the metal film 30, it is possible to reduce the wraparound of the end surface protective film 62 provided on the light emitting end surface 13. In this case, it is preferable the first main surface 11 be a flat plane, and that the thickness of the metal film 30 and the thickness of the electrode 20 be equal, or that the thickness of the metal film 30 be larger. This makes it possible to further reduce the possibility of the end surface protective film 62 provided on the light emitting end surface 13 from reaching the electrode 20. In particular, when forming the end surface protective film 62, when arranging a spacer on the side of the first main surface 11, if the thickness of the metal film 30 and the thickness of the electrode 20 are in that kind of relationship, it is possible to further reduce wraparound of the end surface protective film 62 using the metal film 30 and the spacer.

The metal film 30 is not connected with the electrode 20. For this reason, compared to when the electrode 20 is formed in contact with the first side 11a, there is a lower possibility of a short circuit occurring when forming the light emitting end surface 13. The distance between the electrode 20 and the metal film 30 can be 5 µm or greater. This makes it possible to more reliably separate the electrode 20 and the metal film 30. The distance between the electrode 20 and the metal film 30 can be 20 µm or less.

The length $L_{30}$ along the first side 11a of the metal film 30 is smaller than the length $L_{20}$ in the direction parallel to the first side 11a of the electrode 20. This makes it possible to further reduce the possibility of a short circuit occurring. It is also possible to reduce the probability that the light emitting end surface 13 will be covered by the metal film 30. The length $L_{30}$ along the first side 11a of the metal film 30 indicates the length of the portion in contact with the first side 11a of the metal film 30. The length $L_{20}$ in the direction parallel to the first side 11a of the electrode 20 indicates the item that is largest among the lengths in the direction parallel to the first side 11a of the electrode 20. The length $L_{30}$ along the first side 11a of the metal film 30 may also be smaller than the length in the direction parallel to the first side 11a of the end part of the light emitting end surface 13 side of the electrode 20.

The length $L_{30}$ along the first side 11a of the metal film 30 can be 90% or less than the length $L_{20}$ in the direction parallel to the first side 11a of the electrode 20, is preferably 70% or less, and I more preferably 30% or less. This makes it possible to reduce the possibility of a short circuit occurring. It is also possible to reduce the probability of the light emitting end surface 13 being covered by the metal film 30. The length $L_{30}$ along the first side 11a of the metal film 30 can be 10% or greater than the length $L_{20}$ in the direction parallel to the first side 11a of the electrode 20.

The length $L_{30}$ along the first side 11a of the metal film 30 can be 10 µm or greater, and is preferably 20 µm or greater.

This makes it possible to improve the precision of image recognition of the metal film 30. The length $L_{30}$ along the first side 11a of the metal film 30 can be 100 μm or less. This makes is possible to reduce the possibility of a short circuit occurring.

The longer the length $L_{30}$ along the first side 11a of the metal film 30, the more it is possible to improve the precision of the position specification of the light emitting end surface 13 by doing image recognition of the metal film 30. On the other hand, to reduce the possibility of a short circuit or to reduce the probability of the light emitting end surface 13 being covered by the metal film 30, the shorter the length $L_{30}$ along the first side 11a of the metal film 30 the better. To achieve both of these, it is preferable to provide a plurality of metal films 30. In FIG. 1, two metal films 30 are provided.

The total of the lengths $L_{30}$ along the first side 11a of the plurality of metal films 30 is preferably 30% or greater than a length Li a of the first side 11a. This makes it possible to improve the precision of position specification of the light emitting end surface 13 using the metal films 30. The total of the lengths $L_{30}$ along the first side 11a of the plurality of metal films 30 can be less than the length $L_{11a}$ of the first side 11a. A distance $D_{30}$ from one end to the other end of the direction along the first side 11a of the plurality of metal films 30 is preferably half or greater than the length Li a of the first side 11a, and more preferably ⅔ or greater. This makes it possible to improve the precision of position specification of the light emitting end surface 13 using the metal film 30. The distance $D_{30}$ indicates the distance from the farthest apart ends of the portions of the plurality of metal films 30 in contact with the first side 11a. The distance $D_{30}$ can be less than the length $L_{11a}$ of the first side 11a. The distance $D_{30}$ may be less than the length $L_{20}$ in the direction parallel to the first side 11a of the electrode 20, and may be the length $L_{20}$ or greater than the direction parallel to the first side 11a of the electrode 20. The shortest distance between adjacent metal films 30 among the plurality of metal films 30 is greater than the shortest distance between the metal film 30 and the electrode 20, for example.

As shown in FIG. 1, the metal films 30 are arranged at positions that do not overlap with the optical waveguide 15 in the plan view. This makes it possible to reduce the probability that the light emitting end surface 13 will be covered by the metal films 30. In the plan view, the plurality of metal films 30 can include one set of metal films 30 arranged at a position sandwiching the optical waveguide 15. In the plan view, one or more of the plurality of metal films 30 can be arranged in one region of two regions partitioned by the optical waveguide 15 in the first main surface 11, and another one or more of the plurality of metal films 30 can be arranged in the other region. This makes it possible to have the distance $D_{30}$ from one end to the other end in the direction along the first side 11a of the plurality of metal films 30 be longer than when arranging the plurality of metal film 30 only in one region, and possible to improve the precision of the position specification of the light emitting end surface 13 using the metal films 30. In FIG. 1, one metal film 30 is arranged in one region of the two regions partitioned by the optical waveguide 15 in the first main surface 11, and the other metal film 30 is arranged in the other region.

The plurality of metal films 30 may be arranged with bilateral symmetry using something as a reference, or may not be arranged with bilateral symmetry. With the semiconductor laser element 100 shown in FIG. 1, the plurality of metal films 30 are arranged with bilateral symmetry sandwiching the optical waveguide 15 in the plan view seen along the normal direction of the first main surface 11. In FIG. 1, in the plan view, the optical waveguide 15 is arranged overlapping the connecting line of the center point of the first side 11a and the center point of the second side 11b. In this case, by arranging the plurality of metal films 30 with bilateral symmetry sandwiching the optical waveguide 15 in this way, it is possible to arrange the metal films 30 efficiently. When providing the optical waveguide 15 at a position that does not overlap with the connecting line of the center point of the first side 11a and the center point of the second side 11b, the length $L_{30}$ of the metal film 30 provided at the side having the smaller area of the left side and right side of the optical waveguide 15 is preferably smaller than the length $L_{30}$ of the metal film 30 provided at the other.

The outer edge of the metal film 30 is a quadrangle, for example, in the plan view. The length along the long direction of the optical waveguide 15 of the metal film 30 can be 10 μm or greater, and more preferably is 15 μm or greater. This makes it possible to improve the precision of image recognition of the metal film 30. The length along the long direction of the optical waveguide 15 of the metal film 30 can be less than 40 μm, or can be 35 μm or less, for example. This makes it possible to expand the area of the electrode 20.

The thickness of the metal film 30 is preferably 1 μm or less. This makes it possible to reduce the possibility of the metal film 30 extending during cleaving. The thickness of the metal film 30 can be 0.1 μm or greater. The metal film 30 has one or more layer of a layer of one or more metal such as Ni, Rh, Cr, Au, W, Pt, Ti, Al or an alloy. The metal film 30 uses an Au layer as the outermost surface, for example. The electrode 20 and the metal film 30 can have the same material. The electrode 20 and the metal film 20 can have the same layering structure. This makes it possible to form the electrode 20 and the metal film 30 in the same step, and possible to simplify the manufacturing process. The metal film 30 is sufficient provided it is constituted using a material for which image recognition is possible. For this reason, instead of the metal film 30, for example, it is possible to form a dielectric film that reflects the illumination light when performing image recognition in the same manner as the metal film 30. This kind of dielectric film may have multiple layers, or may have a single layer.

In FIG. 1, the metal films 30 are provided on the first substrate main surface 16a of the substrate 16, but it is also possible to provide the metal films 30 on the semiconductor layer 17. In this case, the surface on the side on which the ridge 17d of the semiconductor layer 17 is provided is the first main surface.

(Second Metal Film 40)

The semiconductor laser element 100 may also have a second metal film 40 provided on the first main surface 11. The second metal film 40 is provided at a position spaced apart from the electrode 20, and is in contact with the second side 11b of the first main surface 11. As described later, to form the metal film 30 (first metal film) to be reliably in contact with the first side 11a, it is preferable to obtain the light emitting end surface 13 by dividing the metal film 30 at a certain position. In this case, one of two surfaces obtained by a single division is used as the light emitting end surface 13, and the other as the light reflecting end surface 14, with the second metal film 40 formed as shown in FIG. 1. Alternatively, in a case when using both of the two surfaces obtained by a single division are used as the light emitting end surface 13, it is possible to not provide the second metal film 40.

By having the second metal film 40, it is possible to reduce the possibility of the end surface protective film 62 shown in FIG. 3 described later from reaching the electrode 20. In this case, it is preferable that the first main surface 11 be a flat plane, and that the thickness of the second metal film 40 and the thickness of the electrode 20 are equal, or that the thickness of the second metal film 40 is greater. This makes it possible to further reduce the possibility of the end surface protective film 62 provided on the light reflecting end surface 14 from reaching the electrode 20. Particularly, when arranging a spacer on the side of the first main surface 11 when forming the end surface protective film 62, if the thickness of the second metal film 40 and the thickness of the electrode 20 are in this kind of relationship, it is possible to further reduce wraparound of the end surface protective film 62 using the second metal film 40 and the spacer.

(Second Electrode 50)

The semiconductor laser element 100 can have a second electrode 50 provided on the second main surface 12. The second electrode 50 can have a contact electrode 51 and a pad electrode 52. The second electrode 50 is a p electrode, for example. The second electrode 50 is not in contact with the outer edge of the second main surface 12, for example. Or, the contact electrode 51 is in contact with the outer edge of the second main surface 12, but the pad electrode 52 is not in contact with the outer edge of the second main surface 12.

In FIG. 2A and FIG. 2B, the ridge 17d is provided on a portion of the semiconductor layer 17, and the contact electrode 51 is in contact with the ridge 17d. The contact electrode 51 has one or more layers of an electrically conductive oxide including at least one selected from a metal of Ni, Rh, CR, Au, W, Pt, Ti, Al, etc. or their alloys, and Zn, In, Sn, for example. As an example of the electrically conductive oxide, an example includes ITO (Indium Tin Oxide), for example. The pad electrode 52 has one or more layers of a layer of a metal of Ni, Rh, Cr, Au, W, Pt, Ti, Al or their alloy, etc., for example. The pad electrode 52 is a layer including Au such as one with the outermost surface being an Au layer, etc., for example.

The electrode 20 (first electrode) and the second electrode 50 may be provided on the same side. For example, it is possible to provide on the surface of the semiconductor layer 17 a portion at which the first electrically conductive semiconductor layer 17a is exposed and a portion at which the second electrically conductive semiconductor layer 17c is exposed, to form the electrode 20 on the part at which the first electrically conductive semiconductor layer 17a is exposed, and to form the second electrode 50 on the part at which the second electrically conductive semiconductor layer 17c is exposed. In this case, it is possible to form the metal film 30, the electrode 20, and the second electrode 50 on the same side of the semiconductor-containing part 10.

(Other Members)

As shown in FIG. 2A and FIG. 2B, the semiconductor laser element 100 may also have an insulating film 61. The insulating film 61 is provided on the surface of the semiconductor layer 17. A portion of the insulating film 61 and a portion of the second electrode 50 are in contact. As shown in FIG. 3, the semiconductor laser element 100 may also have the end surface protective film 62 provided on both or one of the light emitting end surface 13 and the light reflecting end surface 14. FIG. 3 is a schematic plan view showing another example of the semiconductor laser element 100 of an embodiment. The reflectivity of the end surface protective film 62 provided on the light emitting end surface 13 can be made lower than the reflectivity of the end surface protective film 62 provided on the light reflecting end surface 14. The mode for using the semiconductor laser element 100 is not limited to the mode of using upper part of each drawing as the top, and can use any direction as the top.

(Light Emitting Device 200)

Figure 4A:
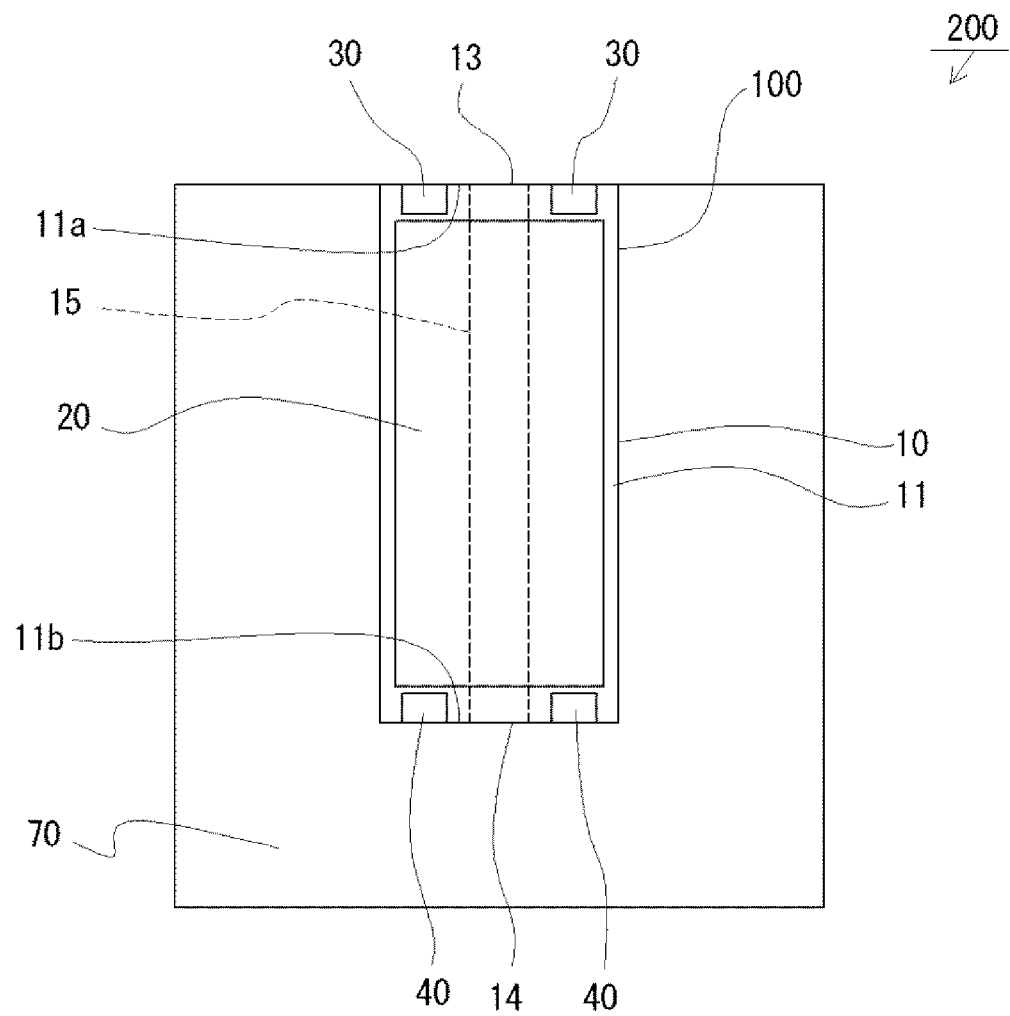
FIG. 4A is a schematic plan view showing a light emitting device of an embodiment according to the present invention.

FIG. 4A is a schematic plan view showing a light emitting device 200 of an embodiment. The light emitting device 200 has the semiconductor laser element 100, and a base 70 to which the semiconductor laser element 100 is fixed. The semiconductor laser element 100 is fixed to the base 70 in an arrangement with the second electrode 50 facing the base 70. The base 70 may also be electrically connected to the semiconductor laser element 100. The base 70 is a sub mount, for example. The base 70 may also be a package.

As shown in FIG. 4A, by fixing the side of the second main surface 12 to the base 70, it is possible to confirm the metal film 30 in a state with the semiconductor laser element 100 fixed to the base 70. This makes it possible to use the metal film 30 in a state with the semiconductor laser element 100 fixed to the base 70 as a reference for pass/fail determination.

Figure 4B:
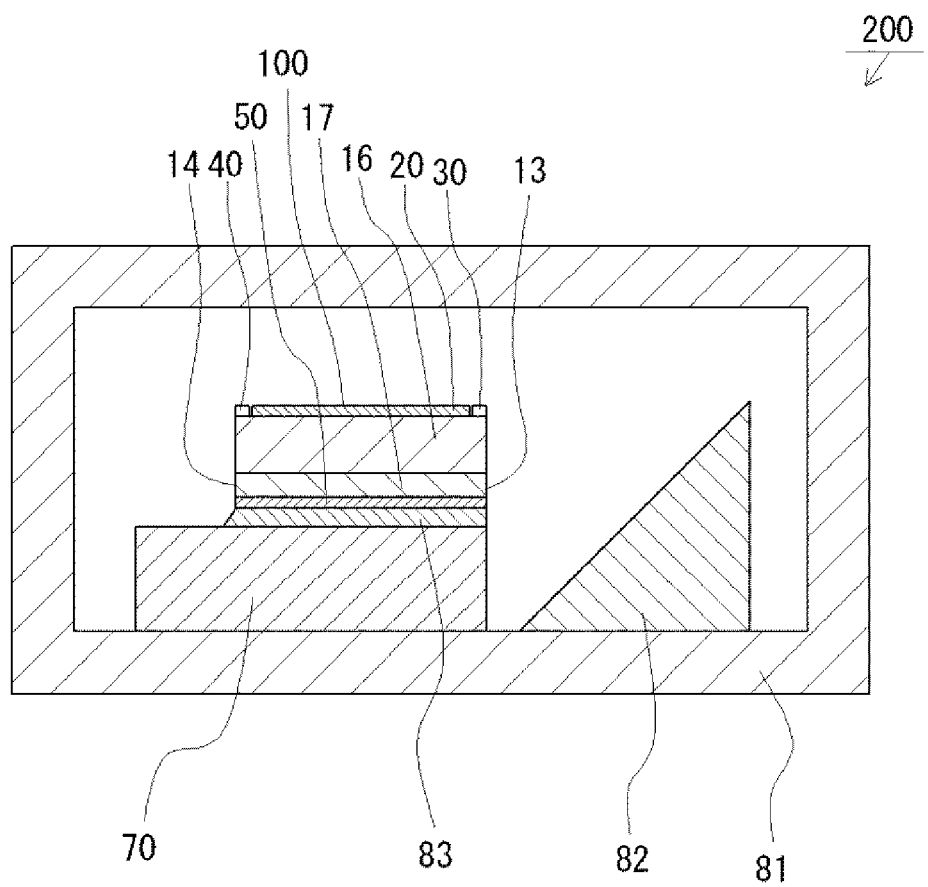
FIG. 4B is a schematic cross section view showing another example of the light emitting device of an embodiment according to the present invention.

FIG. 4B is a schematic cross section view showing another example of the light emitting device 200 of an embodiment. The light emitting device 200 has the semiconductor laser element 100, the base 70 to which the semiconductor laser element 100 is fixed, a package 81, and a reflective member 82.

The base 70 shown in FIG. 4B is a sub mount. The base 70 has an insulating body, and an electrically conductive layer provided on the surface of that body. The insulating body is ceramic, for example. The second electrode 50 of the semiconductor laser element is joined to the electrically conductive layer of the base 70 with an electrically conductive adhesive agent 83 interposed.

The package 81 consists of an electrically conductive material such as a metal, an insulating material such as glass or ceramic, or a composite material of those. The package 81 may be configured by a combination of a plurality of parts. The package 81 has on one part a light transmissive window that transmits laser light. The laser light emitted by the semiconductor laser element 100 is reflected by the reflective member 82, and is emitted to outside the light emitting device 200 by passing through the window of the package 81. The reflective member 82 is unnecessary depending on the position of the window of the package 81. The light emitting device 200 may also have a wavelength conversion member such as a phosphor, etc., provided at the position through which the laser light passes. The package 81 airtightly seals the semiconductor laser element 100. The package 81 has an anode electrode and a cathode electrode. The anode electrode of the semiconductor laser element 100 is electrically connected to the anode electrode of the package with an electrically conductive layer or linear wire, etc., interposed. The cathode electrode of the semiconductor laser element 100 is electrically connected to the cathode electrode of the package with an electrically conductive layer or a linear wire, etc., interposed.

As shown in FIG. 4B, when the side of the semiconductor layer 17 is fixed to the base 70, compared to when the side of the substrate 16 is fixed to the base 70, the distance from the optical waveguide 15 to the base 70 is smaller, and the probability that the laser light emitted by the semiconductor laser element 100 will be blocked by the base 70 is high. For this reason, the arrangement shown in FIG. 4B has a smaller allowable range for the distance between the end part of the base 70 and the end part of the semiconductor laser element 100. With the light emitting device of the present embodiment, by providing the metal film 30, it is possible to improve the precision of the pass/fail determination, so it is possible to expect an improvement in yield.

(Method for Manufacturing a Semiconductor Laser Element)

Figure 5:
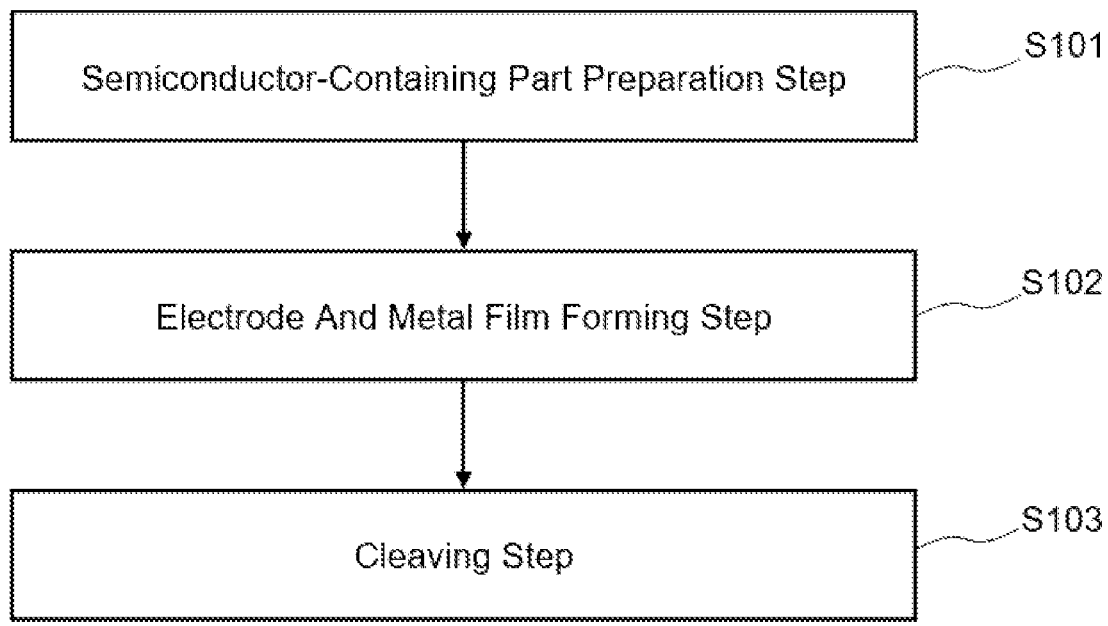
FIG. 5 is a flow chart showing a method for manufacturing a semiconductor laser element of an embodiment according to the present invention.

FIG. 5 is a flow chart showing the method for manufacturing the semiconductor laser element 100 of an embodiment. FIG. 6 to FIG. 10 are schematic plan views or cross section views showing the method for manufacturing the semiconductor laser element 100 of an embodiment. The method for manufacturing the semiconductor laser element 100 has a semiconductor-containing part preparation step S101, an electrode and metal film forming step S102, and a cleaving step S103. For the shape, arrangement, material, etc., of each member in the method for manufacturing the semiconductor laser element 100, the items described above can be used.

(Semiconductor-Containing Part Preparation Step S101)

Figure 6:
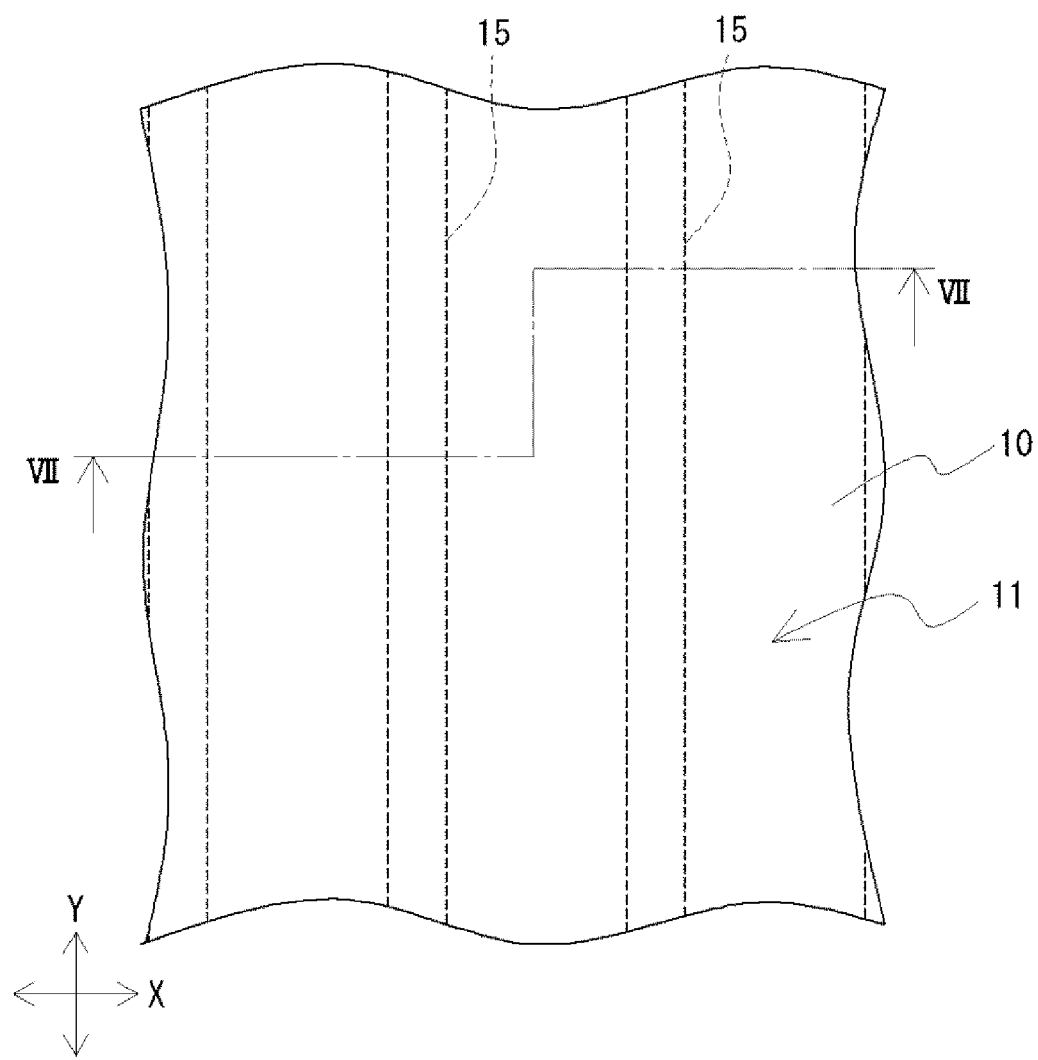
FIG. 6 is a partial schematic plan view showing the method for manufacturing a semiconductor laser element of an embodiment according to the present invention.
Figure 7:
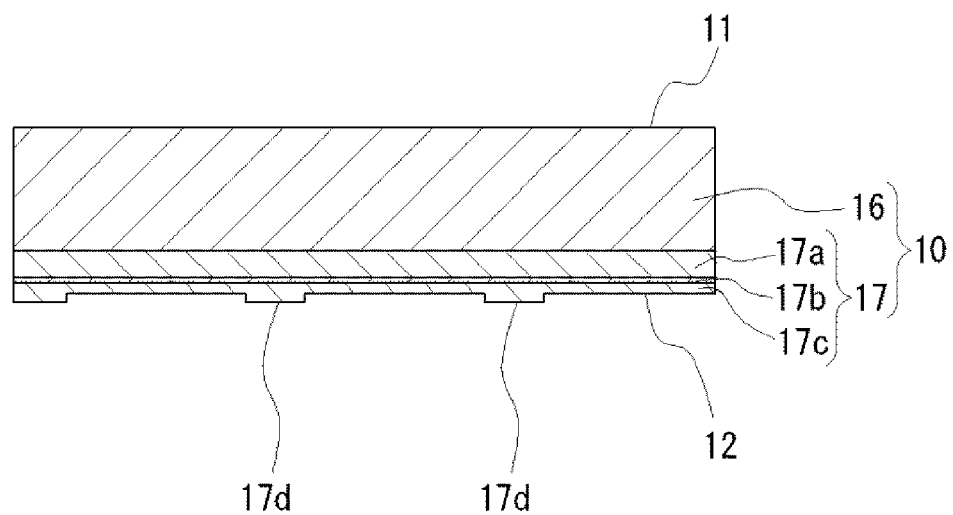
FIG. 7 is a cross section view of line VII-VII of FIG. 6.

In the semiconductor-containing part preparation step S101, as shown in FIG. 6 and FIG. 7, the semiconductor-containing part 10 having the first main surface 11, the second main surface 12, and the optical waveguide 15 is prepared. FIG. 6 is a schematic plan view showing the method for manufacturing the semiconductor laser element of an embodiment. FIG. 7 is a cross section view in line VII-VII of FIG. 6. The distance between the first main surface 11 and the active layer 17b is greater than the distance between the second main surface 12 and the active layer 17b. Because of this, it is possible to say that the distance between the first main surface 11 and the optical waveguide 15 is greater than the distance between the second main surface 12 and the optical waveguide 15. The semiconductor-containing part 10 can have the substrate 16 and the semiconductor layer 17. The semiconductor-containing part 10 has a wafer shape, for example. The semiconductor layer 17 can be formed on the surface of the substrate 16 using a metal organic vapor deposition method (MOCVD method), for example. The ridge 17d can be formed using etching, for example.

(Electrode and Metal Film Forming Step S102)

Figure 8:
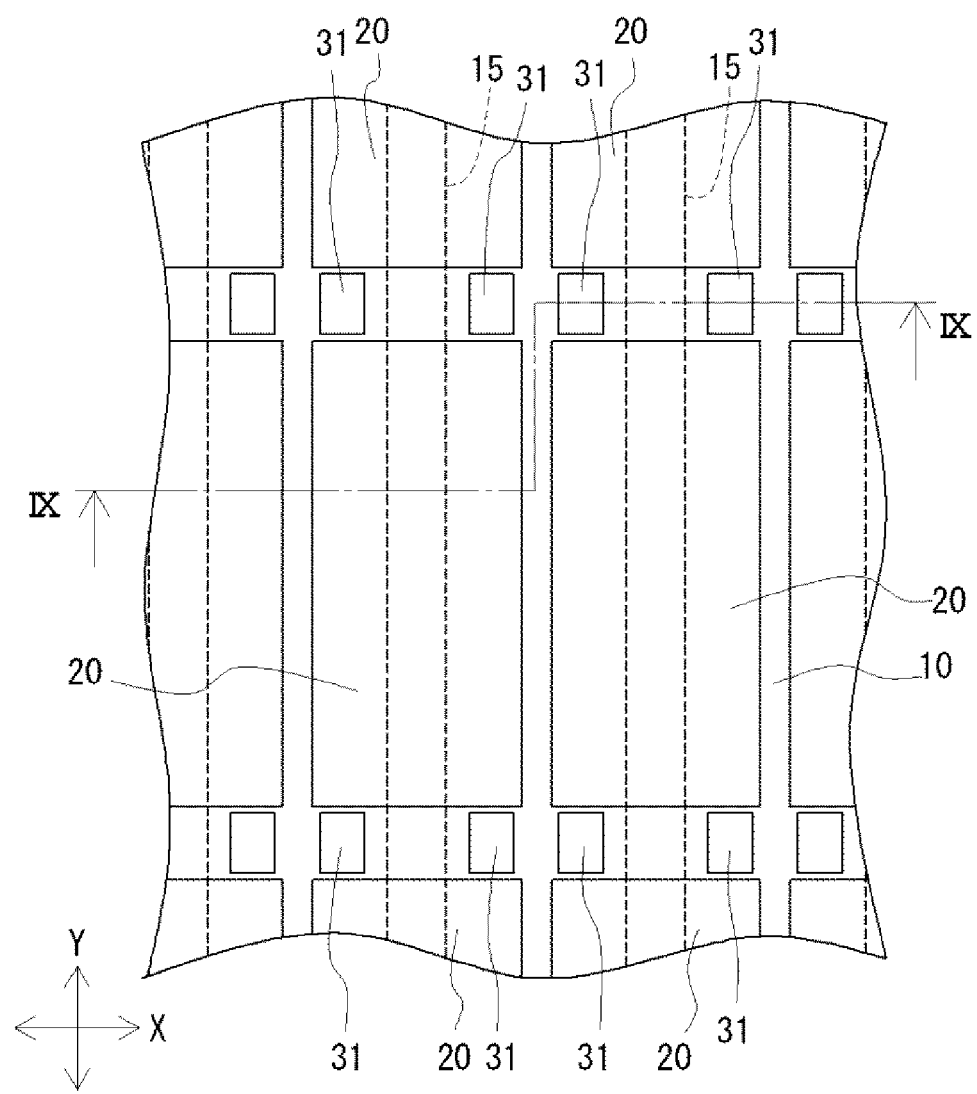
FIG. 8 is a partial schematic plan view showing the method for manufacturing a semiconductor laser element of the embodiment.
Figure 9:
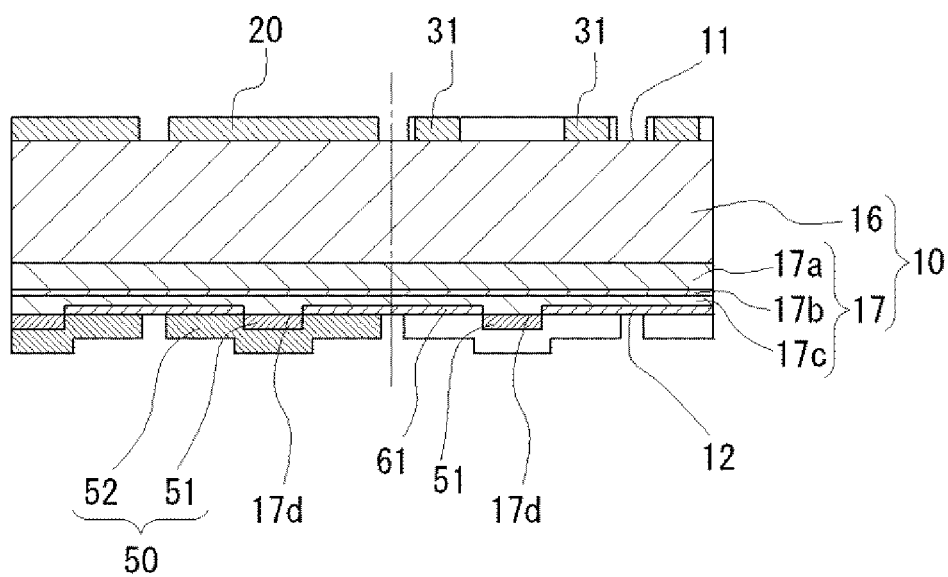
FIG. 9 is a cross section view of line IX-IX of FIG. 8.

In the electrode and metal film forming step S102, as shown in FIG. 8 and FIG. 9, a plurality of electrodes 20 and metal films 31 are formed on the first main surface 11 of the semiconductor-containing part 10. FIG. 8 is a schematic plan view showing the method for manufacturing a semiconductor laser element of an embodiment. FIG. 9 is a cross section view in line IX-IX of FIG. 8. The plurality of electrodes 20 are formed aligned in a first direction Y. The metal films 31 are formed at positions between the plurality of electrodes that are also spaced apart from the plurality of electrodes 20. Specifically, one or more metal films 31 are formed between adjacent electrodes 20. In the metal film 31, the length in a second direction X intersecting the first direction Y is smaller than the length in the second direction X of the electrode 20. The metal films 31 are formed at positions that do not overlap with the optical waveguide 15 in the plan view when seen along the normal direction of the first main surface 11. The electrodes 20 and the metal films 31 can be formed using sputtering or a chemical vapor deposition method (CVD method), for example.

(Cleaving Step S103)

Figure 10:
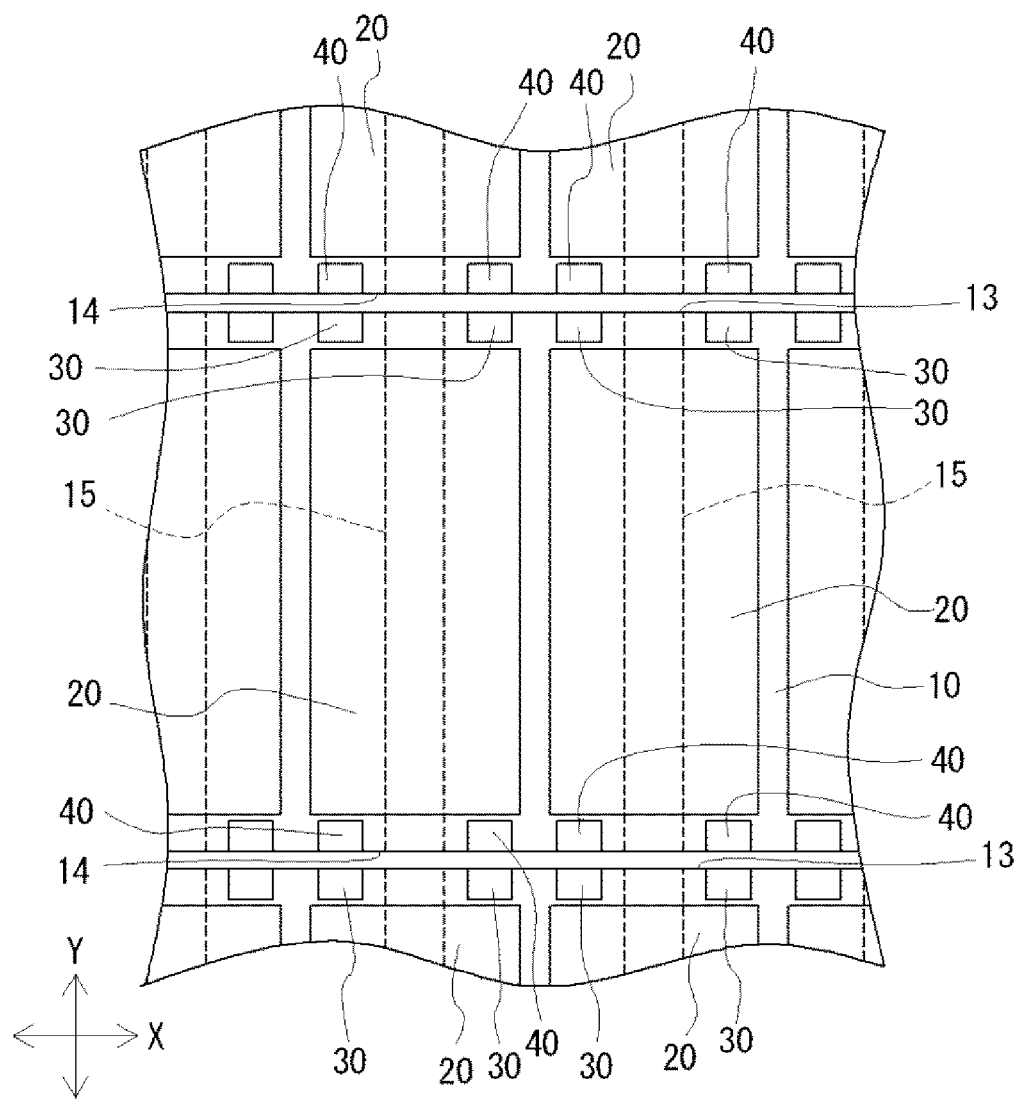
FIG. 10 is a partial schematic plan view showing the method for manufacturing a semiconductor laser element of the embodiment.

In the cleaving step S103, as shown in FIG. 10, cleaving is done between the plurality of electrodes 20, along the second direction X, at a position that divides the metal film 31. FIG. 10 is a schematic plan view showing the method for manufacturing a semiconductor laser element of an embodiment. Cleaving can be done, for example, by first forming a groove using a laser scribing device at a portion of the semiconductor-containing part 10, and after that, by pressing the semiconductor-containing part 10 using a blade. The groove formed using the laser scribing device may also be formed only outside the region that becomes the semiconductor laser element 100. For example, it is possible to form the groove on one end part of a wafer or a laminate that is a divided piece of the divided wafer, and to cleave the laminate using external force along that groove.

By performing the cleaving step S103, the light emitting end surface 13 and the light reflecting end surface 14 are formed. In FIG. 10, of the two surfaces obtained by cleaving once, one is the light emitting end surface 13, and the other is the light reflecting end surface 14. By performing the cleaving step S103, the metal film 31 is divided in two, with one being the metal film 30, and the other being the second metal film 40. When both of the two surfaces obtained by cleaving once are the light emitting end surface 13, one metal film 31 becomes two metal films 30. After the cleaving step, it is also possible to form an end surface protective film 62 on one or both of the light emitting end surface 13 and the light reflecting end surface 14.

Using the steps above, it is possible to obtain the semiconductor laser element 100 that has the metal films 30, and that can improve pass/fail determination precision. After the cleaving step S103, a dividing step can be performed. In the dividing step, the laminate that passed through the cleaving step S103 is divided along a planned division line. The planned division line is the intersection line of the light emitting end surface 13 and the light reflecting end surface 14 obtained by cleaving. The division can be performed, for example, by first forming a groove using a laser scribing device at a position overlapping the planned division line, and after that, by pressing the laminate using a blade. The order of the dividing step and the cleaving step S103 can be changed. A step of forming a member such as a protective film can be performed before the cleaving step S103.

(Method for Manufacturing a Light Emitting Device)

Figure 11:
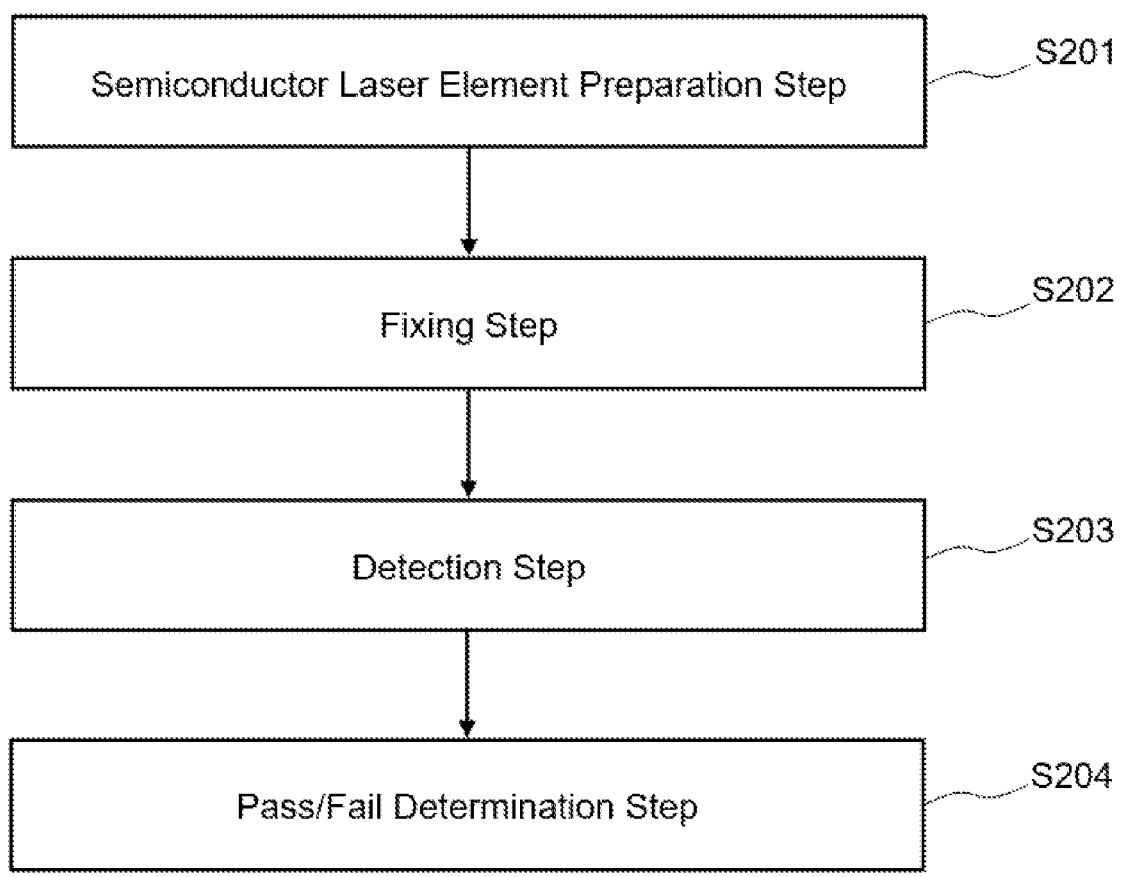
FIG. 11 is a flow chart showing the method for manufacturing a light emitting device of an embodiment according to the present invention.

FIG. 11 is a flow chart showing the method for manufacturing the light emitting device 200 of an embodiment. As shown in FIG. 11, the method for manufacturing the light emitting device 200 shown in FIG. 4A or FIG. 4B has a step of preparing the semiconductor laser element 100 (semiconductor laser element preparation step S201), and a step of fixing the semiconductor laser element 100 to the base 70 (fixing step S202). In the fixing step S202, the semiconductor laser element 100 is fixed to the base 70 in an arrangement with the second main surface 12 facing the base 70. The fixing can be performed by interposing an adhesive agent 83.

After the fixing step S202, it is possible to also have a detection step S203 and a pass/fail determination step S204. In the detection step S203, detected is the outline of a recognition object that includes the metal film 30 of the semiconductor laser element 100, the end part of the base 70, or a part that can be estimated to be the end part. The recognition object can be only these, or may include members other than these. Detection of the outline of the recognition object may also be said to be image recognition of the recognition object. In the pass/fail determination step S204, pass/fail determination is performed using the detected outline of the recognition object. The pass/fail determination can be performed by determining whether the distance between the end part of the base 70 or the part that can be estimated to be the end part and the metal film 30 is within a reference value range, for example. The part that can be estimated as the end part of the base 70 is, for example, a metal layer provided near the end part though it does not match with the end part in the plan view. The distance between the metal layer of the base 70 and the end part of the base 70 is 70 μm or less, for example.

Above, embodiments of the present invention were explained while referring to drawings. However, the present invention is not limited to these specific examples. All modes that can be implemented using suitable design changes by a person skilled in the art based on the embodiments of the present invention described above also are within the scope of the present invention as long as they contain the gist of the present invention. In addition, within the scope of the concepts of the present invention, there are various modified examples and amended examples that can be thought of by a person skilled in the art, and these modified examples and amended examples are understood to belong to the scope of the present invention.

What is claimed is:

1. A semiconductor laser element comprising:
   a semiconductor-containing part having a first main surface, a second main surface, a light emitting end surface, a light reflecting end surface, and an optical waveguide, a distance between the first main surface and the optical waveguide being greater than a distance between the second main surface and the optical waveguide;
   an electrode provided on the first main surface; and
   at least one metal film provided on the first main surface at a position spaced apart from the electrode, wherein
   in a plan view seen along a normal direction of the main surface,
      an outer edge of the first main surface has a first side on a side of the light emitting end surface,
      the at least one metal film is in contact with the first side of the outer edge of the first main surface, and
      the at least one metal film is arranged at a position that does not overlap the optical waveguide.

2. The semiconductor laser element according to claim 1, wherein
   at least a portion of the electrode is arranged at a position that overlaps the optical waveguide in the plan view.

3. The semiconductor laser element according to claim 1, wherein
   a length of the at least one metal film along the first side is smaller than a length of the electrode in a direction parallel to the first side.

4. The semiconductor laser element according to claim 1, wherein
   a length of the at least one metal film along the first side is 70% or less than a length of the electrode in a direction parallel to the first side.

5. The semiconductor laser element according to claim 1, further comprising
   a plurality of metal films including the at least one metal film, each of the metal films being provided on the first main surface at a position spaced apart from the electrode.

6. The semiconductor laser element according to claim 5, wherein
   a total length of the metal films along the first side is 30% or greater than a length of the first side.

7. The semiconductor laser element according to claim 5, wherein
   two of the metal films are respectively arranged at positions sandwiching the optical waveguide in the plan view.

8. The semiconductor laser element according to claim 5, further comprising
   at least one second metal film provided on the first main surface at a position spaced apart from the electrode, and in contact with a second side of the outer edge of the first main surface on a side of the light reflecting end surface.

9. The semiconductor laser element according to claim 1, wherein
   the semiconductor-containing part has
      a substrate that has a first substrate main surface constituting the first main surface, and a second substrate main surface on a side opposite to the first substrate main surface, and
      a semiconductor layer provided on the second substrate main surface of the substrate.

10. The semiconductor laser element according to claim 9, further comprising
    a second electrode provided on the second main surface.

11. The semiconductor laser element according to claim 1, further comprising
    a protective film covering at least one of the light emitting end surface and the light reflecting end surface of the semiconductor-containing part.

12. A light emitting device comprising:
    the semiconductor laser element according to claim 1; and
    a base on which the semiconductor laser element is fixed with the second main surface of the semiconductor-containing part facing the base.

13. A semiconductor laser element comprising:
    a semiconductor-containing part having a first main surface, a second main surface, a light emitting end surface, a light reflecting end surface, and an optical waveguide, a distance between the first main surface and the optical waveguide being greater than a distance between the second main surface and the optical waveguide;
    an electrode provided on the first main surface at a position spaced apart from the light emitting end surface in a plan view seen along a normal direction of the first main surface; and
    at least one metal film provided on the first main surface at a position spaced apart from the electrode and the optical waveguide in the plan view, an edge of the at least one metal film being flush with the light emitting end surface in the plan view.

14. The semiconductor laser element according to claim 13, further comprising
    a plurality of metal films including the at least one metal film, each of the metal films being provided on the first main surface at a position spaced apart from the electrode and the optical waveguide in the plan view, and an edge of each of the metal films being flush with the light emitting end surface in the plan view.

15. The semiconductor laser element according to claim 14, further comprising
    at least one second metal film provided on the first main surface at a position spaced apart from the electrode, and an edge of the at least one second metal film being flush with the light reflecting end surface in the plan view.

16. A light emitting device comprising:
    the semiconductor laser element according to claim 13; and a base on which the semiconductor laser element is fixed with the second main surface of the semiconductor-containing part facing the base.

\* \* \* \* \*